United States Patent [19]

Cheng et al.

[11] Patent Number: 4,927,485

[45] Date of Patent: May 22, 1990

[54] LASER INTERFEROMETER SYSTEM FOR MONITORING AND CONTROLLING IC PROCESSING

[75] Inventors: David Cheng, San Jose; Robert P. Hartlage, Santa Clara; Wesley W. Zhang, Burlingame, all of Calif.

[73] Assignee: Applied Materials, Inc., Santa Clara, Calif.

[21] Appl. No.: 225,158

[22] Filed: Jul. 28, 1988

[51] Int. Cl.$^5$ .................... G01B 11/06; H01L 21/306
[52] U.S. Cl. .................... 156/345; 356/355; 356/357; 156/626
[58] Field of Search ............... 156/626, 345, 643, 627; 356/355, 357; 422/68

[56] References Cited

U.S. PATENT DOCUMENTS

| 4,618,262 | 10/1986 | Maydan et al. | 356/357 |
| 4,660,980 | 4/1987 | Takabayashi et al. | 356/357 |

FOREIGN PATENT DOCUMENTS

| 0202940 | 10/1985 | Japan | 156/626 |
| 0218006 | 10/1985 | Japan | 356/357 |

Primary Examiner—Kenneth M. Schor
Assistant Examiner—Todd J. Burns
Attorney, Agent, or Firm—Philip A. Dalton

[57] ABSTRACT

A laser end point detector incorporating adjustable-focus, variable-orientation detection optics for monitoring different types of structures such as laser-transparent thin films, isolated trenches or holes and patterned arrays of trenches or holes is disclosed. A collector lens package comprising a laser and a focusing lens are mounted in a hole in a collector lens which is pivotally mounted for selectively focusing zero, first and higher orders of diffractions reflected from the wafer onto an associated detector to monitor the etching of different types of structures. For example, zero order diffraction signals are used to monitor the etching of large target areas in transparent thin films or of non-patterned trenches or holes. First order (or higher) diffraction signals are used for monitoring the etching of patterned features which effect a two-dimensional diffraction grating, such as the capacitor holes in dynamic random access memories.

4 Claims, 2 Drawing Sheets

FIG. 4
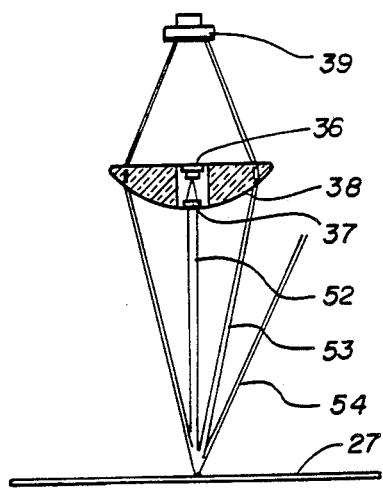
FIG. 5
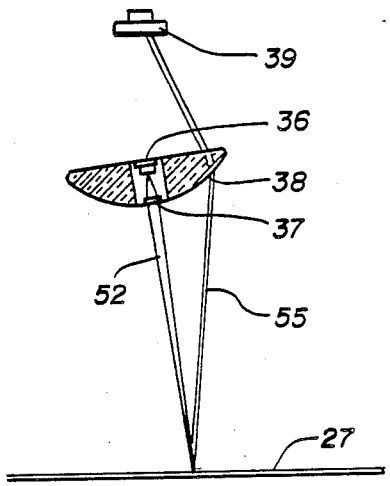
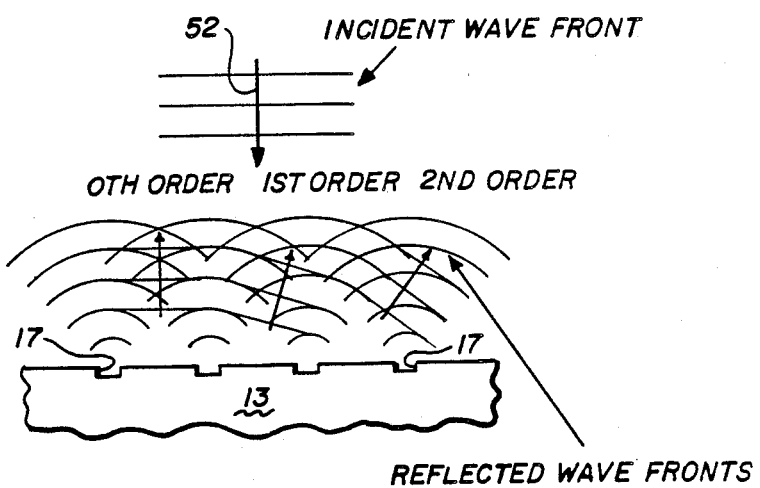
FIG. 6

LASER INTERFEROMETER SYSTEM FOR MONITORING AND CONTROLLING IC PROCESSING

BACKGROUND OF THE INVENTION

The present invention relates to the etching of features in, and the removal of the layer(s) of an integrated circuit and, in particular, to laser interferometer systems and techniques for monitoring such etching, including etching to a given depth or to end point and the time rate of change of thickness.

In IC (integrated circuit) technology, dry etching techniques including plasma chemical etching and plasma reactive ion etching are used to selectively fabricate the layers of the IC chip, for example, by replicating mask patterns in constituent layers such as dielectric thin films and silicon substrates. During dry etching, automatic trench depth detection is very important for process control and for the performance characteristics of the resulting IC.

FIGS. 1 and 2 depict the laser interferometer etch-monitoring techniques for thin films and trench holes. The laser beam 11 reflected from the top of a film 12 on a layer 13 such as silicon is interfered with the beam 14 reflected from the bottom of the film, when the film is transparent to the laser light (FIG. 1), or with the beam 16 reflected from the bottom of a hole or trench 17 in the layer (FIG. 2).

The thickness d of the layer and the wavelength $\lambda$ of the laser light are related by $2d = N(\lambda/n)$, where n is the refractive index. For integral values $N = 1, 2, 3$, etc., interference is constructive and reflected intensity is a maximum, whereas for half integral values $N = \frac{1}{2}, 3/2, 5/2$, etc., the reflected light interferes destructively and the intensity is a minimum. During etching (or deposition), the characteristic sinusoidal optical interference pattern of repetitive maxima and minima is monitored. This pattern terminates upon complete removal of the layer, signaling the etching end point. Also, the distance between adjacent maxima or minima, $\frac{1}{2}(\lambda/n)$, is one-half the effective wavelength of the laser light in the layer and provides a convenient basis for determining the thickness of the material which has been removed from the layer (by multiplying the number of cycles by the distance or thickness of material removed per cycle) and the time rate of etching.

However, the laser light must be illuminated onto a target area of the associated layer which typically occupies a small percentage of the total circuit or die area. Also, other IC structure within the target area may scatter the laser light. As a consequence of such factors, it may be difficult to detect the small target area of interest and the reflected laser beam may have an undesirably low signal-to-noise ratio. Commonly assigned U.S. Pat. No. 4,618,262, filed Apr. 13, 1984, issued Oct. 21, 1986, to Maydan et al, which is incorporated here by reference in its entirety, addresses the above problems, in part, by monitoring relatively structure-free topographical features such as scribe lines and focusing the laser beam to a small area relative to the target feature. Also, the laser beam is repetitively scanned across the scribe line while monitoring the resulting interference pattern. Alternatively, the beam is scanned across the line for detection and locked onto the detected line for monitoring the resulting interference pattern. The incorporated '262 patent also refers to the possible use of laser beams to generate diffraction interference patterns from an appropriate repetitive array of IC features such as repetitively-spaced lines.

SUMMARY OF THE INVENTION

It is one object of the present invention to provide a laser interferometer system and technique for accurately monitoring etching, including etching depth and end point, during such disparate etch operations as the removal of dielectric layers and the formation of trenches and holes.

In one aspect, the present invention which achieves the above and other objectives is embodied in a laser interferometer system having a laser mounted within an aspherical condensing lens which is rotatable or pivotal to intercept various diffraction orders in all directions selected according to the type of IC feature which is to be monitored.

BRIEF DESCRIPTION OF THE DRAWINGS

These and other features of the present invention are described in detail with reference to the associated drawings in which:

FIGS. 4 and 5 are partial, enlarged views in the manner of FIG. 3 illustrating the monitoring of different types of etched structures; and FIG. 6 schematically depicts the diffraction grating effect of trenches or holes.

DETAILED DESCRIPTION OF THE PREFERRED EMBODIMENTS(S)

Figure 3:
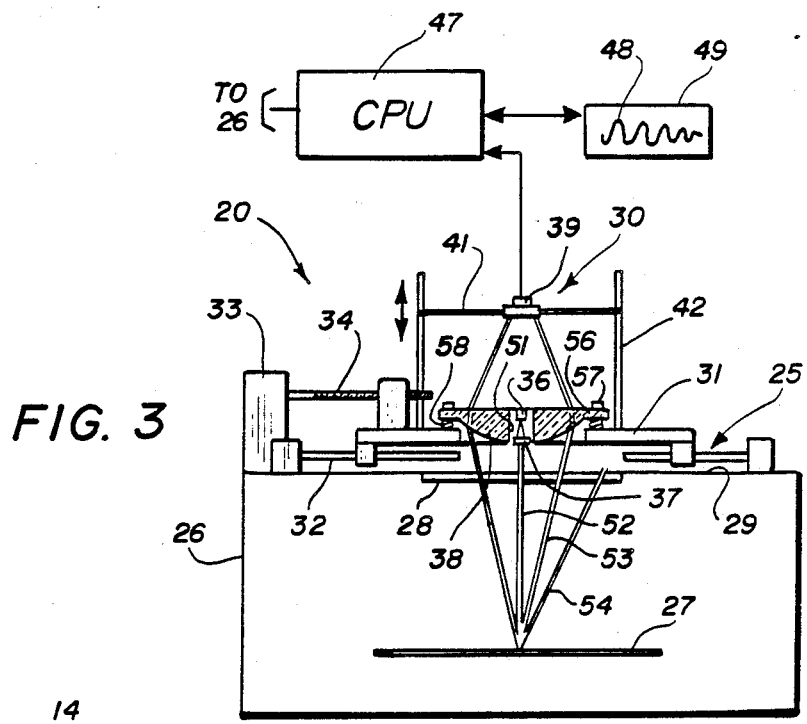
FIG. 3 is a schematic illustration, not-to-scale, of a preferred working embodiment of the laser interferometer monitoring system according to the present invention.
Figure 1:
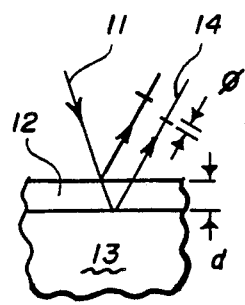
FIGS. 1 and 2 schematically illustrate a laser interferometer process for monitoring the etch patterning of a laser-transparent layer and a trench/hole, respectively.
Figure 2:
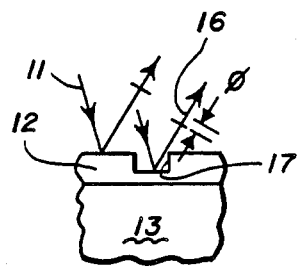

FIG. 3 schematically depicts a preferred embodiment 20 of our laser end point detector, which includes a moving carriage or stage 25 mounted on a semiconductor processing reactor system 26. The carriage 25 supports the entire laser detector optics system 30 which is used to monitor the etching of workpieces such as wafer 27 via window 28 in chamber wall 29. One such reactor system 26 is disclosed in co-pending, commonly assigned U.S. patent application, Ser. No. 185,215, filed Apr. 25, 1988, in the name of Cheng et al, now U.S. Pat. No. 4,842,683, which application is hereby incorporated by reference in its entirety.

In its present version, the stage 25 comprises a base plate 31 slidably mounted along rails 32 for reciprocal movement along the wall 29 and window 28 by a stepper motor 33-driven lead screw 34. (The center section of the rail 32 is deleted in FIG. 3 to more clearly illustrate lens 38.)

The laser optics system 30 includes a laser pen which comprises a diode laser 36 and an associated focusing lens 37, both of which are mounted in a central aperture 51 within a collector lens 38. A photodetector 39 is mounted on a second, elevated platform or plate 41 which is supported by posts 42. The platform 41 can be raised or lowered along posts 42 to select the reflected diffraction order. The collector lens 38 is supported by a kinematic mount comprising a plate 56 which supports the collector lens 38 and which is supported on three adjustment screws 57 threaded into base plate 31 and journaled between the screw heads and compression springs 58. Adjustment of the screws affords pivotal or tilting movement of the lens 38, e.g., about associated axes in the plane of the base plate 31.

A standard personal computer 47 such as the IBM AT is interfaced with the detector 39, stepper motor 33, and associated power supplies in a conventional manner for controlling operation of the photodetector 39, scanning of the stage 25 and analysis of the output signal from the photodetector 39 for terminating (and starting, if desired) the etch process. Visual readout 48 at a display device 49 such as a printer and/or monitor provides comprehensive graphics, plots, records of input data, filtered data, etched depth, etch rate, etc., as desired.

The orientation of the pivotal collector lens 38 relative to the planar workpiece 27 by the kinematic mount selects the diffraction order directed onto the detector 39 by the collector lens according to the type of target structure being etched.

For example, many semiconductor structures contain a pattern of etched features which act like a two-dimensional diffraction grating. This includes VLSI dynamic random access memories (DRAM's) in which bit storage is in capacitors formed in micron and submicron size holes arranged in a grid pattern, one hole per cell. Illustratively, for a sixteen megabit chip there are sixteen million holes on the chip which form a very regular, simple grid pattern which can be used as a two-dimensional diffraction grating for first and higher orders of diffraction. See FIG. 6. To monitor the etching of such holes, the lens 37 is used to focus the laser light to a wide area on the target 27. Also, as shown in FIG. 4, the collector lens 38 is oriented so that first order diffraction light (designated 53 in FIG. 4) or higher ordered diffractions in all directions (collectively designated 54) is collected by the collector lens onto the photodetector 39. Specifically, in FIG. 4 the collector lens is oriented with its axis substantially perpendicular to the normal to the plane of the wafer 27. First order diffraction is usually preferred over higher orders because of its higher intensity. The etch fabrication process generates an output trace of the type 48 as shown in FIG. 3, for determining the distance etched and etch rate.

For etch monitoring and end point detection of thin films, such as those depicted in FIG. whose features do not form a diffraction grating, zero order diffraction is used during monitoring. As shown in FIG. 5, the pivotable collector lens 38 is oriented at a small angle relative to the orientation of FIG. 4 so that zero order diffraction light 55 is incident on detector 39, and the lens 37 is used to focus the laser light 52 sharply onto the wafer 27. Again, the etch fabrication process generates an output trace of the type 48 as shown in FIG. 3 for determining dimension etched, etch rate and end point.

In short, to provide maximum signal strength monitoring of patterned etched features such as holes or trenches, preferably a relatively wide area beam spot is used and the collector lens assembly is oriented so that the first order diffraction light is directed to the detector. To monitor features which do not form a diffraction pattern, such as transparent dielectric films or non-patterned holes or trenches, the light is sharply focused to a relatively small area on the substrate 27 to minimize the wafer area illuminated by the laser and the collector assembly is oriented so that zero order diffraction light is detected by the detector 39.

In a working embodiment, our laser end point detector system was mounted on a Precision Etch 5000 system available from assignee, which is the system described in the referenced patent application. The laser 36 was a 5 milliwatt, 780 nm diode laser selected from the Sharp LT-022 MC family. Focusing was provided by a 5 millimeter diameter lens 37 having a focal length of 10 millimeter. The focus spot was varied by adjusting the distance between the laser pen 36, focusing lens 37 and the laser 36. For diffraction pattern monitoring, the beam 52 was focused to a relatively wide area of approximately 1 millimeter, whereas for thin film monitoring (for which the target area of interest is very small), the beam was focused sharply on the wafer, using a focus area as small as 0.01 millimeter in diameter. The collector lens 38 was an aspherical condenser lens with a focal length of 53 millimeters and a diameter of 65 millimeters, f/0.8. The detector 39 was a UDT PIN-10 silicon photodiode detector having a detector area one centimeter in diameter, operated in the photoconductive mode. Computer 47 was an IBM PC AT.

Optionally, we incorporated a narrow band pass filter just below the detector 39 to reduce background noise and enhance the signal-to-noise ratio. Also, in the systems like the Precision Etch 5000 Reactor which use rotating magnetic fields, the plasma intensity varies with the field rotation, and it is useful to filter out the resulting rotational frequency in the detector output signal by using a computer analysis program which incorporates an algorithm which applies a sliding average of the number corresponding to the number of samples for each rotation. This averaging scheme is much like a notch filter which reduces the rotational disturbance to a minimum. Also, we have applied digital filtering using a finite impulse response (FIR) technique, the simplest approach being to convolute a sine wave with a frequency comparable to the signal frequency, thereby providing an enhanced signal which is free of DC background.

As is typical of laser interferometer end point detectors, the etch depth is obtained by counting the number of accumulated cycles of the signal, with each complete cycle corresponding to an additional etched depth of one-half wavelength of the light source, in this case, 0.375 micrometer. While maxima or minima or other cyclical points can be used, we find it best to use zero crossings of the oscillating signal. Since the filter arrangement removes all background DC levels as well as high frequency noise, the zero crossing points are easily obtained by applying a linear least squares fit to the data points in the neighborhood of the zero crossing. In calculating the intersection of this least squares fit line with the x axis (time axis) to obtain the best zero crossing point, each successive zero crossing point corresponds to a one-half cycle or a one-half wavelength, here, 0.19 micrometer. Intermediate points can be readily interpolated by assuming that the etch rate does not vary significantly in the intervening length of time (for example, eleven seconds, where the etch rate is about one micrometer per minute).

Having thus described preferred and alternative embodiments of our present invention as well as the preferred present working embodiment, it is to be understood that those of usual skill in the art will readily derive various modifications and improvements of our invention which are encompassed by the following claims.

We claim:

1. A laser interferometer system for monitoring the etching of a workpiece, comprising: a laser for providing laser light; and for positioning a workpiece such that laser light from said laser is reflected off of said workpiece; detecting means for detecting laser light reflected from a surface of the workpiece; means for analyzing the detected light to monitor at least one of etch rate, etch depth and etch-through of a selected layer of the workpiece; and, a collector lens mounting the laser within said collector lens; means for mounting said collected lens in said interferometer system, such that said collector lens is pivotally movable relative to said workpiece surface to focus selected diffraction orders of light reflected from said workpiece surface into said detecting means.

2. The system of claim wherein said collector lens further mounts a lens within said collector lens for focusing light from the laser onto said workpiece surface.

3. A reactor system for etching a workpiece and automatically terminating etching upon reaching a given condition selected from a predetermined etch depth and etch-through of a selected layer on the workpiece, comprising: a chamber for etching a workpiece therein, said chamber having a window formed in one wall thereof; and a laser interferometer system mounted adjacent said window and immediately outside said chamber and comprising a laser unit oriented for directing a beam of coherent light through said window onto a layer on said workpiece; means for positioning a workpiece such that laser light from said laser unit is reflected off of said workpiece; detector means for detecting laser light reflected from the workpiece; a collector lens mounting the laser unit within said collector lens; means for mounting said collector lens in said interferometer system, said collector lens being pivotally mounted adjacent said window relative to said workpiece layer to focus selected diffraction orders of light from said workpiece layer onto said detector; and means responsive to signals from said detector for terminating etching upon reaching a given condition selected from a given etch depth and etch-through of said selected layer.

4. The system of claim 3, wherein said collector lens further mounts a lens within said collector lens for focusing light from the laser unit onto said workpiece.

* * * * *